(12) United States Patent
Fujii et al.

(10) Patent No.: US 6,688,731 B1
(45) Date of Patent: Feb. 10, 2004

(54) PIEZOELECTRIC THIN FILM ELEMENT, INK JET RECORDING HEAD USING SUCH A PIEZOELECTRIC THIN FILM ELEMENT, AND THEIR MANUFACTURE METHODS

(75) Inventors: Satoru Fujii, Osaka (JP); Isaku Kanno, Nara (JP); Ryoichi Takayama, Osaka (JP); Osamu Watanabe, Kumamoto (JP); Kenji Tomita, Kumamoto (JP); Shigeyuki Takao, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/701,856
(22) PCT Filed: Apr. 5, 2000
(86) PCT No.: PCT/JP00/02208
§ 371 (c)(1), (2), (4) Date: Dec. 1, 2000
(87) PCT Pub. No.: WO00/60676
PCT Pub. Date: Oct. 12, 2000

(30) Foreign Application Priority Data

Apr. 6, 1999 (JP) .......................................... 11-098895

(51) Int. Cl.[7] ................................................ B41J 2/045
(52) U.S. Cl. ............................................................ 347/68
(58) Field of Search .............................. 347/68, 54, 70, 347/71, 72; 29/25.35; 216/27

(56) References Cited

U.S. PATENT DOCUMENTS

| 5,581,861 | A | 12/1996 | Lee et al. | |
| 5,754,205 | A | 5/1998 | Miyata et al. | |
| 5,922,218 | A | 7/1999 | Miyata et al. | |
| 5,984,447 | A | * 11/1999 | Ohashi | 347/9 |
| 6,364,468 | B1 | * 4/2002 | Watanabe et al. | 347/68 |
| 6,390,608 | B1 | * 5/2002 | Mitsuzawa et al. | 347/70 |
| 6,402,971 | B2 | * 6/2002 | Hashizume et al. | 216/27 |

FOREIGN PATENT DOCUMENTS

| EP | 0 691 693 A1 | 1/1996 | |
| EP | 0 698 490 A2 | 2/1996 | |
| EP | 0 736 915 A1 | 10/1996 | |
| EP | 0 800 920 A2 | 10/1997 | |
| EP | 0 838 336 A2 | 4/1998 | |
| EP | 0 841 165 A2 | 5/1998 | |
| JP | 4-170077 | 6/1992 | |
| JP | 9-156098 | 6/1997 | |
| JP | 10-135528 | 5/1998 | |
| JP | 10-211705 | 8/1998 | |
| JP | 10-217487 | 8/1998 | |
| JP | 411138809 A | * 5/1999 | B41J/2/045 |

* cited by examiner

Primary Examiner—Anh T. N. Vo
(74) Attorney, Agent, or Firm—Harness, Dickey & Pierce, P.L.C.

(57) ABSTRACT

A piezoelectric thin film element D, in which a piezoelectric thin film 1 with first and second electrode films 2 and 3 respectively formed on its opposite surfaces in the thickness direction is held by a hold film 5, is fabricated by forming each film 1, 2, 3, and 5 on a film formation substrate 11 and removing the film formation substrate 11 by etching. Even when the hold film 5 is made of material such as resin and therefore exhibits relatively poor adhesion with respect to the other films, the piezoelectric thin film 1 is protected from damage by etchant because the first electrode film 2 which comes into contact with the film formation substrate 11 is formed such that the overall circumference of a peripheral edge portion of the first electrode film 2 laterally extends beyond the lateral surface of the piezoelectric thin film 1 and closely adheres to the hold film 5.

16 Claims, 8 Drawing Sheets

Fig. 4
(a) 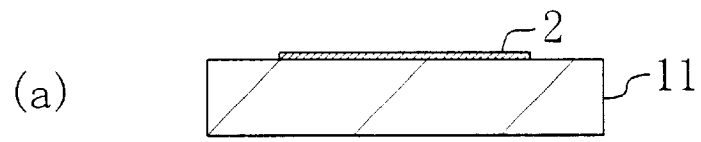
(b) 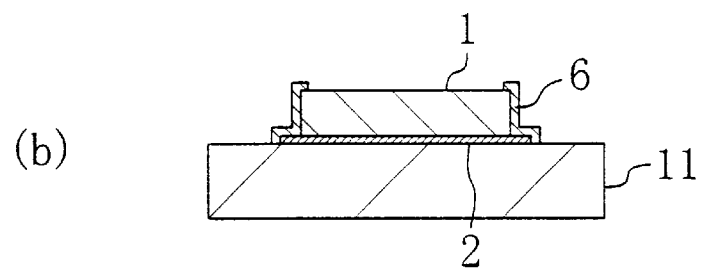
(c) 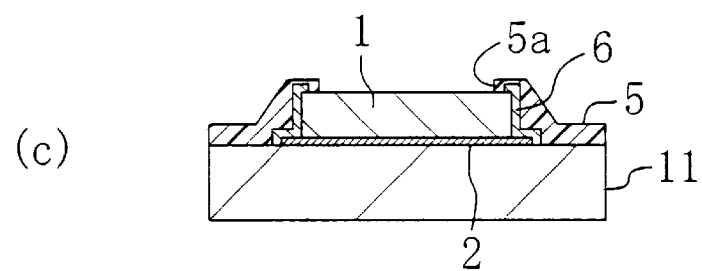
(d) 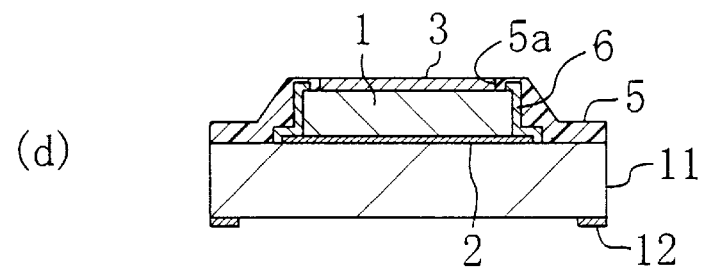
(e) 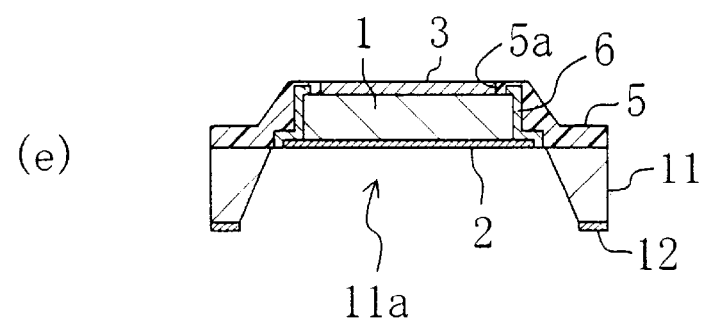

PIEZOELECTRIC THIN FILM ELEMENT, INK JET RECORDING HEAD USING SUCH A PIEZOELECTRIC THIN FILM ELEMENT, AND THEIR MANUFACTURE METHODS

TECHNICAL FIELD

The present invention belongs to the field of technologies relating to a piezoelectric thin film element that comprises a piezoelectric thin film, first and second electrode films respectively formed on opposite surfaces of the piezoelectric thin film in the thickness direction thereof, and a hold film for holding the piezoelectric thin film, to an ink jet recording head employing such a piezoelectric thin film element, and to their manufacture methods.

BACKGROUND ART

Generally, such a type of piezoelectric thin film element has been used as a pyroelectric device for conversion of heat into electric charge or as a piezoelectric device for conversion of mechanical energy into electric energy, and vice versa. Their piezoelectric thin film is usually formed of ferroelectric material such as PZT and PLZT.

The performance of such a piezoelectric thin film element is much influenced by how its piezoelectric thin film is held. For the case of pyroelectric devices, it is required that the piezoelectric thin film be held so that the sensor part decreases in thermal capacity and thermal conductance. On the other hand, for the case of piezoelectric devices, it is required that the piezoelectric thin film be held so that the sensor part undergoes much more deformation by mechanical quantity.

In order to meet the above requirements, Japanese Unexamined Patent Gazette No. H04-170077 proposes a pyroelectric infrared detector (a piezoelectric thin film element) in which a pyroelectric thin film (a piezoelectric thin film) is held by an organic thin film (a hold film) of polyimide resin or the like. In addition to this proposal, there is also proposed a method for the manufacture of such a detector. In accordance with this prior art method, a pyroelectric thin film is formed on a substrate used for film formation. Then, an upper electrode film is formed on the pyroelectric thin film. Following this, an organic thin film is so formed as to cover the pyroelectric thin film. Then, a hold substrate is fixed onto the organic thin film. Thereafter, the film formation substrate is removed by etching. This is followed by formation of an lower electrode film on a surface of the pyroelectric thin film on the side of the film formation substrate before its removal.

However, there is the problem with this prior art proposal. That is, when the film formation substrate is etched away, the pyroelectric thin film is exposed to etchant. As a result, the pyroelectric film damages by etchant. To cope with this drawback, the lower electrode film is, first of all, formed on (or brought into contact with) the film formation substrate and a pyroelectric thin film is then formed on the lower electrode film. As a result of such arrangement, at the time of etching away the film formation substrate, the pyroelectric thin film can be prevented from exposure to etchant because of the presence of the lower electrode film. In this case, generally the lower electrode film and the pyroelectric thin film are set such that their opposing surfaces are substantially the same in size and shape. In addition, the overall circumferences of these opposing surfaces are positioned exactly one upon another and the organic thin film is so formed as to closely adhere to the overall circumference of the lateral surface of each of the lower electrode film and the pyroelectric thin film.

However, the organic thin film, which serves as a hold film of resin material, exhibits poor adhesion to the lower electrode film and to the pyroelectric thin film. As a result, during the etching removal step, there occurs etchant penetration along the interface between the lower electrode film and the hold film. The route, along which the etchant which has penetrated along the interface travels to reach the pyroelectric thin film, is short and straight, so that the etchant will arrive soon at the pyroelectric thin film and finally penetrate along the interface between the pyroelectric thin film and the hold film due to the poor adhesion described above. Accordingly, it is difficult to ensure that the pyroelectric thin film is protected from damage by etchant.

The present invention was made to overcome the above-described disadvantages of the prior art. Accordingly, an object of the present invention is to ensure that the piezoelectric thin film is protected from damage by etchant. More specifically, when fabricating a piezoelectric thin film element, in which a piezoelectric thin film is held by a hold film as described above, by forming on a film formation substrate respective films and thereafter removing the film formation substrate by etching, it is possible to protect, by devising an electrode film that comes into contact with the film formation substrate, the piezoelectric thin film from damage by etchant even when the hold film exhibits poor adhesion to the other films because the hold film comprises resin or the like.

DISCLOSURE OF THE INVENTION

The above-described object of the present invention will be accomplished in the following way. In accordance with the present invention, a first electrode film, which is brought into contact with a film formation substrate, is formed such that the overall circumference of a peripheral edge portion of the first electrode film laterally extends beyond the lateral surface of a piezoelectric thin film and closely adheres to a hold film. Alternatively, a hold film is so formed as to closely adhere, through a protective film, to the overall circumference of the lateral surface of a piezoelectric thin film and the protective film is formed so that the overall circumference of an end portion of the protective film on the side of a first electrode film closely adheres to a peripheral edge portion of the first electrode film.

A first invention is disclosed which is directed to a piezoelectric thin film element. The piezoelectric thin film element of the first invention comprises a piezoelectric thin film, a first and a second electrode film which are formed respectively on opposite surfaces of the piezoelectric thin film in the direction of the thickness of the piezoelectric thin film, and a hold film which is so formed as to closely adhere to the overall circumference of a lateral surface of the piezoelectric thin film and which holds the piezoelectric thin film. Further, the piezoelectric thin film element is manufactured by forming on a film formation substrate all of the films with the first electrode film brought into contact with the film formation substrate and thereafter by removing a portion of the film formation substrate corresponding to at least the piezoelectric thin film. In the piezoelectric thin film element of the first invention, the first electrode film is formed such that the overall circumference of a peripheral edge portion of the first electrode film extends beyond the lateral surface of the piezoelectric thin film and closely adheres to the hold film.

In the above-described structure, the peripheral edge portion of the first electrode film laterally projects beyond the lateral surface of the piezoelectric thin film. If the projection amount of the peripheral edge portion of the first electrode film is set to an adequate value, this achieves that, even when there occurs etchant penetration along the interface between the peripheral edge portion of the first electrode film and the hold film, the etchant has to take a lengthy and curved route to reach the piezoelectric thin film. That is, on the way to the piezoelectric thin film, the etchant stops penetrating along the interface, so that the etchant will not penetrate deeper toward the piezoelectric thin film. Therefore, even when the hold film is made of, for example, resin material, the piezoelectric thin film can be protected from damage by etchant without fail.

A second invention is disclosed which is directed to a piezoelectric thin film element. The piezoelectric thin film element of the second invention comprises a piezoelectric thin film, a first and a second electrode film which are formed respectively on opposite surfaces of the piezoelectric thin film in the direction of the thickness of the piezoelectric thin film, and a hold film which is so formed as to closely adhere to the overall circumference of a lateral surface of the piezoelectric thin film and which holds the piezoelectric thin film. Further, the piezoelectric thin film element is manufactured by forming n a film formation substrate all of the films with the first electrode film brought into contact with the film formation substrate and thereafter by removing a portion of the film formation substrate corresponding to at least the piezoelectric thin film. In the piezoelectric thin film element of the second invention, the hold film is so formed as to closely adhere, through a protective film, to the overall circumference of the lateral surface of the piezoelectric thin film and the protective film is formed such that the overall circumference of an end portion of the protective film on the side of the first electrode film closely adheres to a peripheral edge portion of the first electrode film.

As a result of such arrangement, the piezoelectric thin film is covered with the first electrode film and the protective film. It is possible to enhance the adhesion between the first electrode film and the protective film. Therefore, it is possible to prevent etchant from coming into contact with the piezoelectric thin film. On the other hand, even when the adhesion between the protective film and the hold film is poor resulting in etchant penetration along the interface between these films, the etchant has to take a lengthy and curved route to reach the piezoelectric thin film. That is, on the way to the piezoelectric thin film, the etchant stops penetrating along the interface between the protective film and the hold film, so that the etchant will not penetrate deeper toward the piezoelectric thin film. Accordingly, the same operation and effects as the first invention can be obtained.

A third invention is disclosed in which the piezoelectric thin film of each first and second invention is formed of ferroelectric material. As a result of such arrangement, it becomes possible to facilitate obtaining high-performance pyroelectric devices and piezoelectric devices.

A fourth and a fifth invention are disclosed which are directed to their respective ink jet recording heads making utilization of the piezoelectric thin film element of the first invention. The fourth invention is directed to an ink jet recording head comprising:

(a) a piezoelectric thin film element;
the piezoelectric thin film element comprising a piezoelectric thin film formed of ferroelectric material, a first and a second electrode film which are formed respectively on opposite surfaces of the piezoelectric thin film in the direction of the thickness of the piezoelectric thin film, and a hold film which is so formed as to closely adhere to the overall circumference of a lateral surface of the piezoelectric thin film and which holds the piezoelectric thin film;
the piezoelectric thin film element being manufactured by forming on a film formation substrate all of the films with the first electrode film brought into contact with the film formation substrate and thereafter by removing the entire film formation substrate;

(b) a head body;
the head body being positioned, through a diaphragm film, on a surface of the second electrode film of the piezoelectric thin film element on the side opposite to the piezoelectric thin film;
the head body including a recessed portion which becomes a pressure chamber when blocked by the diaphragm film, an ink supply passage for supplying ink to the pressure chamber, and an ink nozzle in communication with the pressure chamber;
wherein the piezoelectric thin film element is operated by applying voltage to the piezoelectric thin film through the first and second electrode films, thereby applying pressure to the pressure chamber to cause the ink in the pressure chamber to jet from the ink nozzle. In the ink jet recording head of the fourth invention, the first electrode film of the piezoelectric thin film element is formed such that the overall circumference of a peripheral edge portion of the first electrode film extends beyond the lateral surface of the piezoelectric thin of film and closely adheres to the hold film.

On the other hand, the fifth invention is directed to an ink jet recording head comprising:

(a) a piezoelectric thin film element;
the piezoelectric thin film element comprising a piezoelectric thin film formed of ferroelectric material, a first and a second electrode film which are formed respectively on opposite surfaces of the piezoelectric thin film in the direction of the thickness of the piezoelectric thin film, and a hold film which is so formed as to closely adhere to the overall circumference of a lateral surface of the piezoelectric thin film and which holds the piezoelectric thin film;
the piezoelectric thin film element being manufactured by forming on a film formation substrate all of the films with the first electrode film brought into contact with the film formation substrate and thereafter by removing a portion of the film formation substrate corresponding to the piezoelectric thin film;

(b) a head body;
the head body being positioned on a surface of the film formation substrate of the piezoelectric thin film element on the side opposite to the first electrode film;
the head body including a recessed portion which forms, together with a portion of the film formation substrate resulting from the etching removal, a pressure chamber, an ink supply passage for supplying ink to the pressure chamber, and an ink nozzle in communication with the pressure chamber; and (c) a diaphragm film which is formed on a surface of the second electrode film of the piezoelectric thin film element on the side opposite to the piezoelectric thin film;
wherein the piezoelectric thin film element is operated by applying voltage to the piezoelectric thin film through the first and second electrode films, thereby applying pressure to the pressure chamber to cause the ink in the pressure chamber to jet from the ink nozzle. In the ink jet recording head of the fifth invention, the first electrode film of the piezoelectric thin film element is formed such that the overall circumference of a peripheral edge portion of the first electrode film extends beyond the lateral surface of the piezoelectric thin film and closely adheres to the hold film.

The fourth and fifth inventions each achieve the same operation and effects that the piezoelectric thin film element of the first invention does. The piezoelectric thin film element of the ink jet recording head of each of the fourth and fifth inventions functions as a piezoelectric actuator by which ink in the pressure chamber is emitted from the ink nozzle. This therefore maintains the ink emission performance of the ink jet recording head at high level.

A sixth and a seventh invention are disclosed which are directed to their respective ink jet recording heads making utilization of the piezoelectric thin film element of the second invention. The sixth invention is directed to an ink jet recording head comprising:

(a) a piezoelectric thin film element;
the piezoelectric thin film element comprising a piezoelectric thin film formed of ferroelectric material, a first and a second electrode film which are formed respectively on opposite surfaces of the piezoelectric thin film in the direction of the thickness of the piezoelectric thin film, and a hold film which is so formed as to closely adhere to the overall circumference of a lateral surface of the piezoelectric thin film and which holds the piezoelectric thin film;
the piezoelectric thin film element being manufactured by forming on a film formation substrate all of the films with the first electrode film brought into contact with the film formation substrate and thereafter by removing a portion of the film formation substrate corresponding to the piezoelectric thin film;

(b) a head body;
the head body being positioned on a surface of the film formation substrate of the piezoelectric thin film element on the side opposite to the first electrode film;
the head body including a recessed portion which forms, together with a portion of the film formation substrate resulting from the etching removal, a pressure chamber, an ink supply passage for supplying ink to the pressure chamber, and an ink nozzle in communication with the pressure chamber; and (c) a diaphragm film which is formed on a surface of the second electrode film of the piezoelectric thin film element on the side opposite to the piezoelectric thin film;
wherein the piezoelectric thin film element is operated by applying voltage to the piezoelectric thin film through the first and second electrode films, thereby applying pressure to the pressure chamber to cause the ink in the pressure chamber to jet from the ink nozzle. In the ink jet recording head of the sixth invention, the hold film of the piezoelectric thin film element is so formed as to closely adhere, through a protective film, to the overall circumference of a lateral surface of the piezoelectric thin film and the protective film is formed such that the overall circumference of an end portion of the protective film on the side of the first electrode film closely adheres to the overall circumference of a peripheral edge portion of the first electrode film.

On the other hand, the seventh invention is directed to an ink jet recording head comprising:

(a) a piezoelectric thin film element;
the piezoelectric thin film element comprising a piezoelectric thin film formed of ferroelectric material, a first and a second electrode film which are formed respectively on opposite surfaces of the piezoelectric thin film in the direction of the thickness of the piezoelectric thin film, and a hold film which is so formed as to closely adhere to the overall circumference of a lateral surface of the piezoelectric thin film and which holds the piezoelectric thin film;
the piezoelectric thin film element being manufactured by forming on a film formation substrate all of the films with the first electrode film brought into contact with the film formation substrate and thereafter by removing the entire film formation substrate;

(b) a head body;
the head body being positioned, through a diaphragm film, on a surface of the second electrode film of the piezoelectric thin film element on the side opposite to the piezoelectric thin film;
the head body including a recessed portion which becomes a pressure chamber when blocked by the diaphragm film, an ink supply passage for supplying ink to the pressure chamber, and an ink nozzle in communication with the pressure chamber; wherein the piezoelectric thin film element is operated by applying voltage to the piezoelectric thin film through the first and second electrode films, thereby applying pressure to the pressure chamber to cause the ink in the pressure chamber to jet from the ink nozzle. In the ink jet recording head of the seventh invention, the hold film of the piezoelectric thin film element is so formed as to closely adhere, through a protective film, to the overall circumference of the lateral surface of the piezoelectric thin film and the protective film is formed such that the overall circumference of an end portion of the protective film on the side of the first electrode film closely adheres to the overall circumference of a peripheral edge portion of the first electrode film.

The sixth and seventh inventions each achieve the same operation and effects that the piezoelectric thin film element of the second invention does and it is possible to maintain the ink emission performance of the recording head at high level.

An eighth and a ninth invention are disclosed which are directed to their respective piezoelectric thin film element manufacture methods. The manufacture method of the eighth invention comprises a step of forming a first electrode film on a film formation substrate, a step of forming a piezoelectric thin film on other than the overall circumference of a peripheral edge portion of the first electrode film, a step of forming a hold film all around the piezoelectric thin film over the film formation substrate so that the hold film closely adheres to the overall circumference of a lateral surface of the piezoelectric thin film and to the overall circumference of the peripheral edge portion of the first electrode film, a step of forming a second electrode film on the piezoelectric thin film, and after completion of all of the above steps, a step of removing, by etching, a portion of the film formation substrate corresponding to at least the piezoelectric thin film.

As a result of such arrangement, the first electrode film is formed such that the overall circumference of a peripheral edge portion of the first electrode film projects laterally beyond the lateral surface of the piezoelectric thin film and closely adheres to the hold film. This facilitates formation of the piezoelectric thin film element of the first invention.

On the other hand, the manufacture method of the ninth invention comprises a step of forming a first electrode film on a film formation substrate, a step of forming a piezoelectric thin film on the first electrode film, a step of forming a protective film all around the piezoelectric thin film over the film formation substrate so that the protective film closely adheres to the overall circumference of a lateral surface of the piezoelectric thin film and to the overall circumference of a peripheral edge portion of the first electrode film, a step of forming a hold film all around the protective film over the film formation substrate so that the hold film closely adheres to the protective film, a step of forming a second electrode film on the piezoelectric thin film, and after completion of all of the above steps, a step of removing, by etching, a portion of the film formation substrate corresponding to at least the piezoelectric thin film.

As a result of such arrangement, the hold film is so formed as to closely adhere, through the protective film, to the overall circumference of the lateral surface of the piezoelectric thin film, and the protective film is formed such that the overall circumference of the end portion of the protective film on the side of the first electrode film closely adheres to the peripheral edge portion of the first electrode film. This facilitates formation of the piezoelectric thin film element of the second invention.

A tenth and an eleventh invention are disclosed which are directed to their respective methods for the manufacture of an ink jet recording head comprising a piezoelectric thin film element which undergoes deformation, together with a diaphragm film, by the piezoelectric effect of a piezoelectric thin film formed of ferroelectric material, thereby causing ink in a pressure chamber to jet therefrom. The manufacture method of the tenth invention comprises a step of forming a first electrode film on a film formation substrate, a step of forming the piezoelectric thin film on other than the overall circumference of a peripheral edge portion of the first electrode film, a step of forming a hold film all around the piezoelectric thin film over the film formation substrate so that the hold film closely adheres to the overall circumference of a lateral surface of the piezoelectric thin film and to the overall circumference of the peripheral edge portion of the first electrode film, a step of forming a second electrode film on the piezoelectric thin film, a step of forming the diaphragm film on the second electrode film, a step of fixing the diaphragm film and a head body having a recessed portion which forms, together with the diaphragm film, a pressure chamber, and, upon completion of all of the above steps, a step of removing, by etching, the entire film formation substrate. This facilitates formation of the ink jet recording head of the fourth invention.

The manufacture method of the eleventh invention comprises a step of forming a first electrode film on a film formation substrate, a step of forming the piezoelectric thin film on the first electrode film, a step of forming a protective film all around the piezoelectric thin film over the film formation substrate so that the protective film closely adheres to the overall circumference of a lateral surface of the piezoelectric thin film and to the overall circumference of a peripheral edge portion of the first electrode film, a step of forming a hold film all around the protective film over the film formation substrate so that the hold film closely adheres to the protective film, a step of forming a second electrode film on the piezoelectric thin film, a step of forming the diaphragm film on the second electrode film, upon completion of all of the above steps, a step of removing, by etching, a portion of the film formation substrate corresponding to the piezoelectric thin film, and after the etching removal step, a step of fixing the film formation substrate and a head body having a recessed portion which forms, together with a portion of the film formation substrate resulting from the etching removal, the pressure chamber. This facilitates formation of the ink jet recording head of the sixth invention.

BRIEF DESCRIPTION OF THE DRAWINGS

FIG. 4 illustrates a method of manufacturing the piezoelectric thin film element of FIG. 3.

BEST MODE FOR CARRYING OUT THE INVENTION

EMBODIMENT 1

Figure 1:
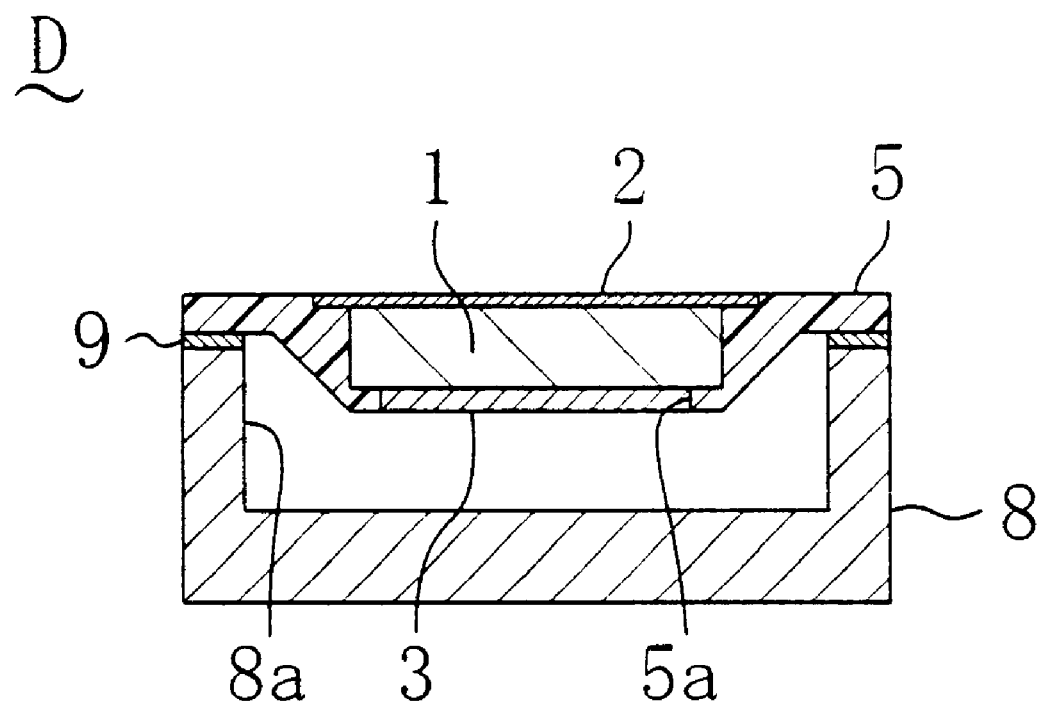
FIG. 1 is a cross-sectional view showing a piezoelectric thin film element according to a first embodiment of the present invention.

Referring to FIG. 1, there is shown a piezoelectric thin film element D according to a first embodiment of the present invention. This piezoelectric thin film element D comprises a piezoelectric thin film 1 formed of a ferroelectric material. The ferroelectric material is expressed by $Pb_xLa_yTi_zZr_wO_3$ and has any one of the following compositions (1) to (5).

$$0.7 \leq x \leq 1, x+y=1, 0.925 \leq z \leq 1, w=0 \quad (1)$$

$$x=1, y=0, 0 \leq z \leq 0.50, z+w=1 \quad (2)$$

$$0.75 \leq x<1, x+y=1, 0.3 \leq z<1, z+w=1 \quad (3)$$

$$x=1, y=0, 0.5 \leq z \leq 1.0, z+w=1 \quad (4)$$

$$0.9 \leq x<1, x+y=1, 0 \leq z<0.5, z+w=1 \quad (5)$$

A first electrode film 2 is formed on one surface (i.e., an upper surface in the film thickness direction) of the piezoelectric thin film 1. A second electrode film 3 is formed on the other surface (i.e., a lower surface in the film thickness direction) of the piezoelectric thin film 1. During manufacture of the piezoelectric thin film element D by the use of a film formation substrate 11 (see FIG. 2), the first electrode film 2 (i.e., the upper electrode film) is first formed on the film formation substrate 11, as will be described later. In other words, the first electrode film 2 is one that is so formed as to come into contact with the film formation substrate 11. Further, the first electrode film 2 is formed such that the overall circumference of a peripheral edge portion of the first electrode film 2 projects laterally beyond the lateral surface of the piezoelectric thin film 1. The amount of such projection is set to from 1 μm to 50 μm. If the projection amount is set below 1 μm, the piezoelectric thin film 1 is not protected sufficiently from possible damage by etchant, as will be explained later. On the other hand, if the projection amount is set above 50 μm, this increases the size of the piezoelectric thin film element D. Accordingly, the projection amount is set as above (i.e., from 1 μm to 50 μm). However, the upper limit of the projection amount is not limited to 50 μm. The projection amount upper limit can be increased as great as possible as long as there is no problem about the size of the piezoelectric thin film element D. It is more preferable that the projection amount be between 10 μm and 30 μm.

Formed laterallyall around the piezoelectric thin film 1 is a hold film 5 made of resin material such as photosensitive polyimide. More specifically, the hold film 5 is formed in such a way as to closely adhere to the overall circumference of the lateral surface of the piezoelectric thin film 1 and to the overall circumference of a lower surface peripheral edge portion of the piezoelectric thin film 1. In addition, the hold film 5 is so formed as to surround the peripheral edge portion of the first electrode film 2. In other words, the hold film 5 is so formed as to closely adhere to the overall circumference of the lateral surface of the first electrode film 2 and to the overall circumference of the peripheral edge portion of the lower surface (i.e., the surface of the first electrode film 2 on the side of the piezoelectric thin film 1), and the upper surface of the hold film 5 positioned laterally to the first electrode film 2 is made flush with that of the first electrode film 2. Further, a contact hole 5a is formed in a portion of the hold film 5 corresponding to the second electrode film 3 and, as will be described later, the second electrode film 3 is formed within the contact hole 5a.

In the construction, a transfer substrate 8 (a hold substrate) with a recessed portion 8a formed in the middle of its upper surface is fixed, at a peripheral portion of the recessed portion 8a, to the overall circumference of the lower surface peripheral edge portion of the hold film 5 through an adhesive layer 9, and the piezoelectric thin film 1 is held in the recessed portion 8a of the transfer substrate 8 by only the hold film 5. The transfer substrate 8 may be formed integrally by a single material. The transfer substrate 8 may be formed by lamination of a plurality of identical or different materials. The transfer substrate 8 may be provided with a through hole instead of the recessed portion 8a.

The piezoelectric thin film element D is manufactured by forming on the film formation substrate 11 the piezoelectric thin film 1, the first and second electrode films 2 and 3, the hold film 5, fixing the transfer substrate 8 to the hold film 5, and removing the entire film formation substrate 11 by etching. The piezoelectric thin film element D can be used as a thin film pyroelectric type infrared detector if the second electrode film 3 is made of infrared absorbing material such as NiCr. Further, the piezoelectric thin film element D can be used as a pressure sensor or as a piezoelectric actuator if the film thickness of the second electrode film 3 is so increased as to enable the second electrode film 3 to function as a diaphragm film or if a diaphragm film is formed on an opposite surface of the second electrode film 3 to the piezoelectric thin film 1.

Figure 2:
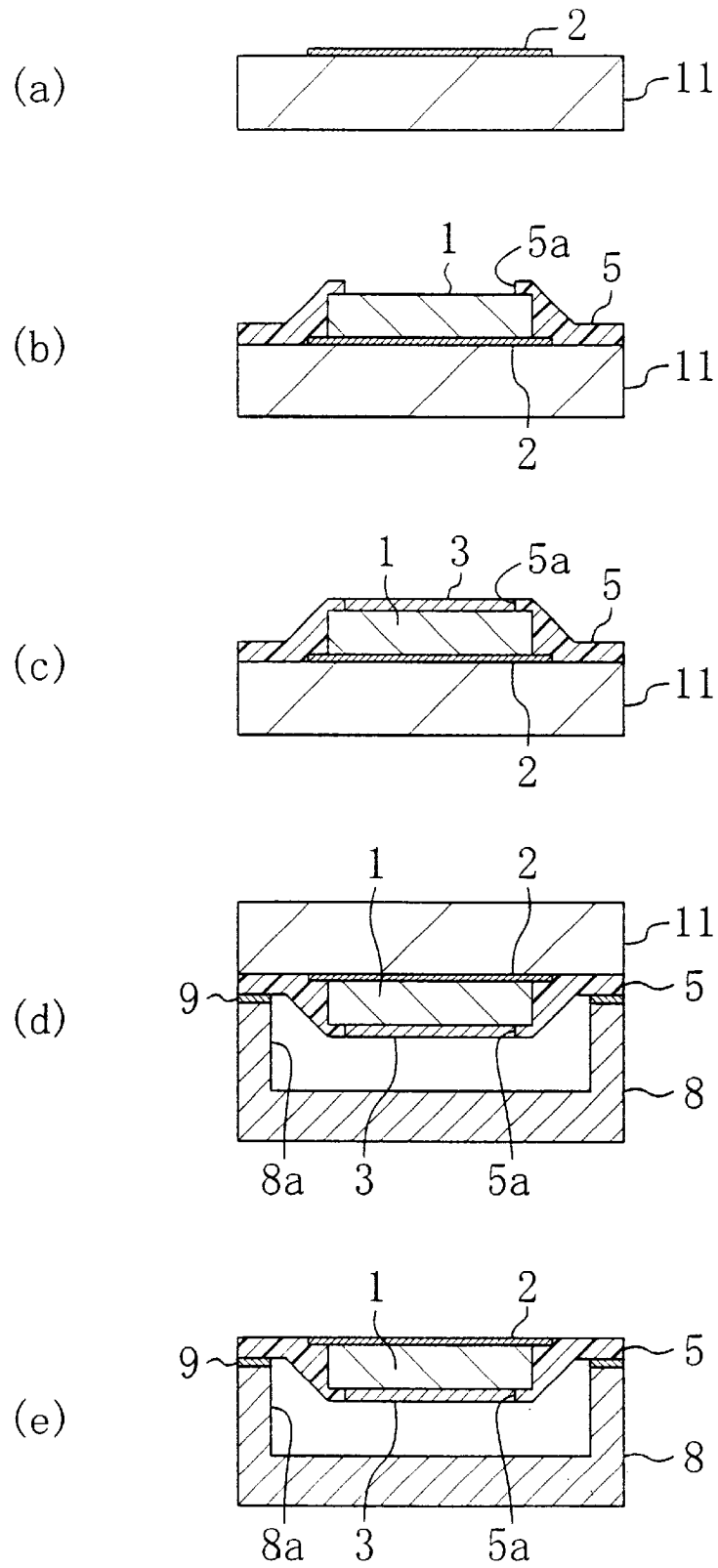
FIG. 2 illustrates a method of manufacturing the piezoelectric thin film element of FIG. 1.

A method for the manufacture of the piezoelectric thin film element D described above will be illustrated by making reference to FIG. 2. First, the first electrode film 2 is formed overlying the film formation substrate 11. The first electrode film 2 is formed by a high frequency magnetron sputtering technique (frequency: 13.56 MHz) and thereafter is subjected to patterning (see FIG. 2(a)). The materials and concrete film formation conditions of the first electrode film 2 are shown in Table 1.

TABLE 1

MATERIALS AND FORMATION CONDITIONS OF FIRST ELECTRODE FILM

| MATERIAL | SUBSTRATE TEMP. (° C.) | SPUTTER GAS | GAS PRESSURE (Pa) | HIGH FREQUENCY POWER (W) | FILM THICKNESS |
|---|---|---|---|---|---|
| Au | 400 to 700 | Ar/O$_2$ = 25/0 to 25/10 | 0.1 to 5 | 50 to 200 | 0.3 |
| Pt | 300 to 800 | Ar/O$_2$ = 25/0 to 25/10 | 0.1 to 5 | 50 to 200 | 0.3 |
| Pd | 300 to 800 | Ar/O$_2$ = 25/0 to 25/10 | 0.1 to 5 | 50 to 200 | 0.3 |
| Ag | 300 to 800 | Ar/O$_2$ = 25/0 to 25/10 | 0.1 to 5 | 50 to 200 | 0.3 |
| Ir | 300 to 800 | Ar/O$_2$ = 25/0 to 25/10 | 0.1 to 5 | 50 to 200 | 0.3 |

The film formation substrate 11 is, for example, a (100) MgO single crystal substrate, in which case the first electrode film 2 orients in the direction of (001). The film formation substrate 11 is not limited to a substrate of (100) MgO single crystal. Any type of substrate such as a (100) Si single crystal substrate may be used as the film formation substrate 11 as long as it is removable by etching.

Next, the piezoelectric thin film 1 is formed on other than the overall circumference of the peripheral edge portion of the first electrode film 2. The piezoelectric thin film 1 is formed by a high frequency magnetron sputtering technique (frequency: 13.56 MHz) and thereafter is subjected to patterning. Table 2 shows concrete film formation conditions when the piezoelectric thin film 1 is made of different ferroelectric materials, namely $PbTiO_3$, PZT ($PbZr_{0.50}Ti_{0.50}O_3$), and PLZT ($Pb_{0.9}La_{0.1}(Zr_{0.1}Ti_{0.9})_{0.975}O_3$), wherein the film thickness is fixed at 2 μm for all the materials and Table 3 shows patterning techniques. Note that like the first electrode film 2 the piezoelectric thin film 1 also orients in the direction of (001).

TABLE 2

FORMATION CONDITIONS OF PIEZOELECTRIC THIN FILM

| MATERIAL | TARGET COMPOSITION | SUBSTRATE TEMP. (° C.) | SPUTTER GAS | GAS PRESSURE (Pa) | HIGH FREQUENCY POWER DENSITY (W/cm$^2$) |
|---|---|---|---|---|---|
| PbTiO$_3$ | PbO/TiO$_2$ POWER MIXTURE (20 mol % excess of PbO) | 500 to 750 | Ar/O$_2$ = 98/2 to 60/40 | 0.05 to 5.0 | 0.5 to 5.0 |
| PZT | PZT SINTERED BODY (20 mol % excess of PbO) | 500 to 800 | Ar/O$_2$ = 98/2 to 60/40 | 0.05 to 5.0 | 0.5 to 5.0 |
| PLZT | PLZT SINTERED BODY (20 mol % excess of PbO) | 500 to 800 | Ar/O$_2$ = 98/2 to 60/40 | 0.05 to 5.0 | 0.5 to 5.0 |

TABLE 3

PATTERNING TECHNIQUES

| MATERIAL | ETCHING METHOD | PROCESS CONDITION | FILM THICKNESS ($\mu$m) | PROCESS TIME (min) |
|---|---|---|---|---|
| PbTiO$_3$ | CHEMICAL ETCHING | HF/HNO$_3$/H$_2$O = 5/0.1/15 to 5/20/15, ETCHANT TEMP. = 25° C. | 2 | 2 |
| PZT | CHEMICAL ETCHING | HF/HNO$_3$/H$_2$O = 5/0.1/15 to 5/20/15, ETCHANT TEMP. = 25° C. | 2 | 3 |
| PLZT | CHEMICAL ETCHING | HF/HNO$_3$/H$_2$O = 5/0.1/15 to 5/20/15, ETCHANT TEMP. = 25° C. | 2 | 3 |

Next, the hold film 5 is formed all over the film formation substrate 11 by spin coating. Thereafter, the contact hole 5*a* is formed in a portion of the hold film 5 corresponding to the second electrode film 3 (see FIG. 2(*b*)). Because of this, the hold film 5 is formed all around the piezoelectric thin film 1 on the film formation substrate 11. More specifically, the hold film 5 is so formed as to closely adhere to the overall circumference of the lateral surface of the piezoelectric thin film 1 and to the overall circumference of a peripheral edge portion of the first electrode film 2. The hold film 5 is made of photosensitive resin material, which contributes to facilitating formation of the contact hole 5*a* in a portion of the hold film 5 corresponding to the second electrode film 3.

This is followed by formation of the second electrode film within the contact hole 5*a* of the hold film 5 over the piezoelectric thin film 1 (see FIG. 2(*c*)). Until this stage, the vertical positional relation is illustrated up side down with respect to when the fabrication of the piezoelectric thin film element D is completed.

Then, the transfer substrate 8 is fixed, through the adhesive layer 9, to the hold film 5 (see FIG. 2(*d*)).

Thereafter, the film formation substrate 11 is etched away entirely by an etchant comprising a phosphoric acid solution (from 5 to 40% by volume) heated up to, for example, from 60 to 80 degrees centigrade (for from 0.5 to 2 hours) and the piezoelectric thin film element D is now completed (see FIG. 2(*e*)).

During the etching removal step, the etchant penetrates along the interface between the first electrode film 2 and the hold film 5. The reason for such etchant penetration is that the adhesion of the interface between the first electrode film 2 and the hold film 5 is relatively low because the hold film 5 is made of resin and formed by spin coating (likewise, the adhesion of the interface between the piezoelectric thin film 1 and the hold film 5 is also relatively low). However, in the first embodiment, the peripheral edge portion of the first electrode film 2 extends laterally beyond the lateral surface of the piezoelectric thin film 1. Because of such lateral projection, the etchant, which has penetrated along the interface, has to take a lengthy and curved passage to reach the piezoelectric thin film 1, and on the way to the piezoelectric thin film 1, the etchant stops penetrating deeper into the interface. As a result, the etchant will not penetrate along the interface between the piezoelectric thin film 1 and the hold film 5. This certainly ensures that the piezoelectric thin film 1 is protected from damage by the etchant. Forming the hold film 5 with resin material provides several advantages. One advantage is that the stress of the piezoelectric thin film 1 after the film formation substrate 11 is removed can be relaxed and another is that the piezoelectric thin film 1 can be held insulatingly within the recessed portion 8*a* of the transfer substrate 8 by only the hold film 5. Accordingly, when using the piezoelectric thin film element D of the present embodiment as a thin film pyroelectric type infrared detector, pressure sensor, or piezoelectric actuator, its performance can be maintained at high level.

EMBODIMENT 2

Figure 3:
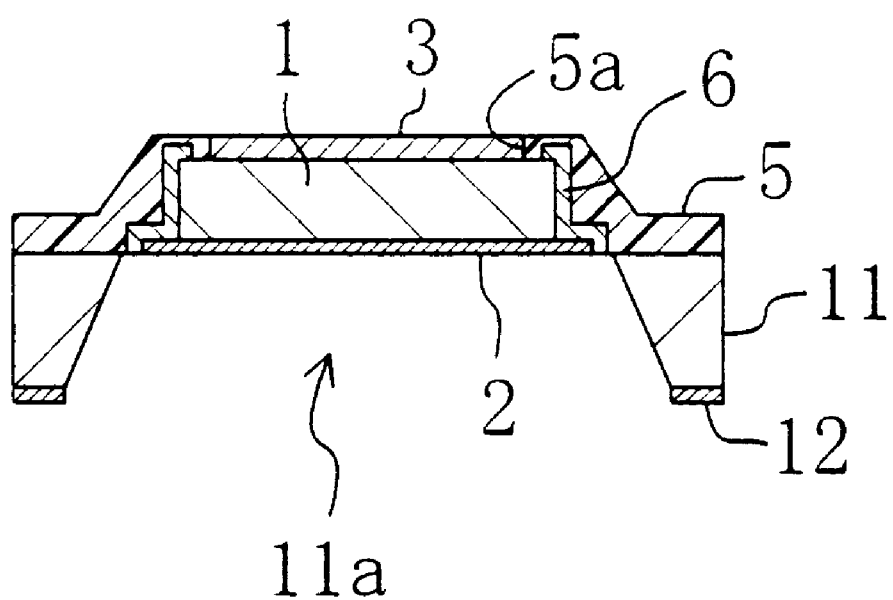
FIG. 3 is a view equivalent to FIG. 1, showing a piezoelectric thin film element according to a second embodiment of the present invention.

FIG. 3 shows a second embodiment of the present invention. In the present embodiment and in each of the following embodiments, the same elements as shown in FIG. 1 have been assigned the same reference numerals and their detailed description is omitted. The second embodiment differs from the first embodiment in having a protective film 6 between the piezoelectric thin film 1 and the hold film 5 and in not removing but leaving a portion of the film formation substrate 11 instead of employing the transfer substrate 8. The vertical positional relationship of the piezoelectric thin film element D is opposite to that of the first embodiment.

In the second embodiment, the hold film 5 is so formed as to closely adhere, through the protective film 6, to the overall circumference of the lateral surface of the piezoelectric thin film 1. Although the material of the protective film 6 is not limited to a particular material, it is preferable that the protective film 6 be made of material such $SiO_2$, $Si_3N_4$, MgO, NiO, $Al_2O_3$, et cetera, so that the occurrence of a short circuit between the first and second electrode films 2 and 3 can be prevented and the adhesion between the protective film 6 and the piezoelectric thin film 1 can be enhanced to a considerable extent. The overall circumference of an end portion (a lower end portion) of the protective film 6 on the side of the first electrode film 2 is closely adhered to the overall circumference of a peripheral edge portion of the first electrode film 2, i.e., both the overall circumference of the lateral surface of the first electrode film 2 and the overall circumference of an upper surface peripheral edge portion of the first electrode film 2 (or only to the latter). On the other hand, the overall circumference of an upper end portion of the protective film 6 is closely adhered to an upper surface peripheral edge portion of the piezoelectric thin film 1. This brings the hold film 5 into direct contact with the piezoelectric thin film 1, only in the vicinity of the contact hole 5a.

The film formation substrate 11 is a substitute for the transfer substrate 8 of the first embodiment and serves as a hold substrate. The film formation substrate 11 has an etching removal portion 11a as a result of removing, by etching, its corresponding portion to the piezoelectric thin film 1 and the etching removal portion 11a has a tapered internal surface. A mask layer 12 is formed on other than the etching removal portion 11a of the lower surface of the film formation substrate 11.

The piezoelectric thin film element D of the present embodiment is one that is used as a thin film pyroelectric type infrared detector, a pressure sensor, a piezoelectric actuator, et cetera, as in the first embodiment.

Reference is now made to FIG. 4 which describes a method for the manufacture of the piezoelectric thin film element D of the present embodiment. In the first place, as in the first embodiment, the first electrode film 2 is formed on the film formation substrate 11 (see FIG. 4(a)). Thereafter, the piezoelectric thin film 11 is formed on other than the overall circumference of a peripheral edge portion of the first electrode film 2.

This is followed by formation of the protective film 6 all around the piezoelectric thin film 1 and the first electrode film 2 on the film formation substrate 11 by a sputtering technique. At this time, the protective film 6 is so formed as to closely adhere to the overall circumference of the lateral surface of the first electrode film 2, to the overall circumference of an upper surface peripheral edge portion of the first electrode film 2, to the overall circumference of the lateral surface of the piezoelectric thin film 1, and to the overall circumference of an upper surface peripheral edge portion of the piezoelectric thin film 1 (see FIG. 4(b)).

Thereafter, the hold film 5 is formed all around the circumference of the protective film 6 on the film formation substrate 11, being closely adhering to the protective film 6 (see FIG. 4(c)). The hold film 5 is formed in the same way as in the first embodiment.

Following this, the second electrode film 3 is formed within the contact hole 5a of the hold film 5 and, in addition, the mask layer 12 is formed on other than the etching removal portion 11a of the lower surface of the film formation substrate 11 (see FIG. 4(d)).

In the next step, a portion of the film formation substrate 11 corresponding to the piezoelectric thin film 1 (the etching removal portion 11a) is removed by etching to complete the piezoelectric thin film element D (see FIG. 4(e)). At this time, in the case the film formation substrate 11 is a (100) MgO single crystal substrate, the use of an etchant comprising an acid solution (e.g., a solution of phosphoric acid) facilitates formation of the etching removal portion 11a having a tapered internal surface. Further, in the case the film formation substrate 11 is a (100) Si single crystal substrate, the use of an etchant comprising an alkaline solution such as KOH makes it possible to provide a diaphragm structure with a (111) plane exposed. Furthermore, in the case the film formation substrate 11 is a (110) Si single crystal substrate, the use of an etchant comprising an alkaline solution such as KOH makes it possible to provide the etching removal portion 11a having an internal surface which is not tapered but extends vertically.

During the etching removal step, it is impossible for the etchant to penetrate along the interface between the first electrode film 2 and the protective film 6 at which adhesion is strong and the etchant will never reach the piezoelectric thin film 1 through the interface. On the other hand, there occurs etchant penetration along the interface between the hold film 5 and the protective film 6 at which adhesion is weak. However, the etchant thus penetrated has to take a lengthy and curved passage to arrive at the piezoelectric thin film 1 and, on the way to the piezoelectric thin film 1, the etchant stops penetrating deeper toward the piezoelectric thin film 1. Accordingly, the same operation and effects as the first embodiment can be achieved.

Figure 5:
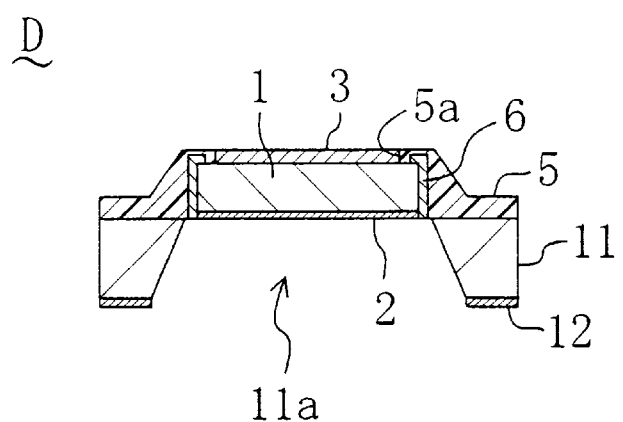
FIG. 5 is a view equivalent to FIG. 1, showing a variation of the piezoelectric thin film element of the second embodiment.

In the second embodiment, the first electrode film 2 is formed such that the overall circumference of the peripheral edge portion of the first electrode film 2 projects laterally beyond the lateral surface of the piezoelectric thin film 1, as in the first embodiment. However, as shown in FIG. 5, an arrangement may be made in which surfaces of the piezoelectric thin film 1 and the first electrode film 2 which are opposite to each other have substantially the same dimensions and shape and the overall circumferences of their peripheral edge portions are positioned exactly one upon another. Even in this case, if the protective film 6 is formed such that a lower end portion of the protective film 6 closely adheres to the overall circumference of the lateral surface (as the overall circumference of a peripheral edge portion) of the first electrode film 2 this prevents the occurrence of etchant penetration along the interface between the first electrode film 2 and the protective film 6, thereby ensuring that the piezoelectric thin film 1 can be protected from damage by etchant.

In the second embodiment, the film formation substrate 11 is used as a hold substrate. An alternative arrangement may be made in which the film formation substrate 11 is etched away entirely and a hold substrate is provided on the side of the film formation substrate 11 or a hold substrate is provided on the opposite side to the film formation substrate 11, like the transfer substrate 8 of the first embodiment. On the contrary, the film formation substrate 11 may serve as a hold substrate in place of the transfer substrate 8 in the first embodiment. Accordingly, any type of hold substrate may be useful, and even in the case there is provided no hold substrate, it is possible to attach the piezoelectric thin film element D to a head body 21 (see FIG. 6), as will be described later and it is sufficient that the manner of the piezoelectric thin film element D is determined according to the use thereof.

Further, in each of the first and second embodiments, the hold film 5 is made of a photosensitive polyimide resin. However, the present invention is applicable even when the hold film 5 is made of a different type of resin or of material other than resin material.

Additionally, in each of the first and second embodiments, the piezoelectric thin film 1 is made of ferroelectric material. However, the piezoelectric thin film 1 may be made of pyroelectric material not included in the ferroelectric material or piezoelectric material not included in the pyroelectric material, depending upon the use.

EMBODIMENT 3

Figure 6:
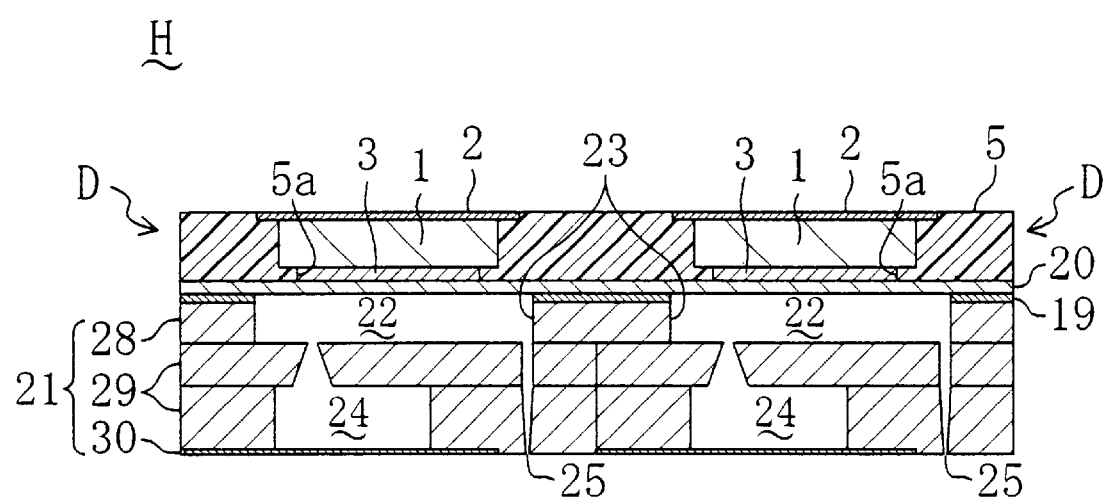
FIG. 6 is a cross-sectional view of an ink jet recording head according to a third embodiment of the present invention.

FIG. 6 shows an ink jet recording head H in accordance with a third embodiment of the present invention. In this recording head H, the piezoelectric thin film element D of the first embodiment is used as a piezoelectric actuator. The transfer substrate 8 is not provided and the head body 21 is provided through a diaphragm film 20 in place of the transfer substrate 8. The vertical positional relation of the piezoelectric thin film element D is opposite to the first embodiment. Moreover, a plurality of the piezoelectric thin film elements D are connected together by the hold film 5 to become integral.

That is to say, in the third embodiment, the entire lower surface of the hold film 5 of the piezoelectric thin film element D and the lower surface (the surface of the second electrode film 3 on the opposite side to the piezoelectric thin film 1) of the second electrode film 3 are the same surface and the diaphragm film 20 is formed on the entire lower surfaces of the second electrode film 3 and the hold film 5. This diaphragm film 20 is formed of material with great Young's modulus including metal such as NiCr and Cr and insulator such as $SiO_2$ and the thickness of the diaphragm film 20 is set below 10 µm.

The head body 21 is fixed to the lower surface of the diaphragm film 20 through an adhesive layer 19. The head body 21 has a recessed portion 23 which forms a pressure chamber 22 when blocked up by the diaphragm film 20, an ink supply passage 24 for supplying ink to the pressure chamber 22, and an ink nozzle 25 in communication with the pressure chamber 22. The head body 21 comprises an upper structure member 28 forming the side walls of the recessed portion 23, two intermediate structure members 29 and 29 forming the bottom wall of the recessed portion 23, the ink supply passage 24, and the ink nozzle 25, and a lower structure member 30 forming the bottom wall of the ink supply passage 24.

When voltage is applied, through the first and second electrode films 2 and 3, to the piezoelectric thin film 1, the piezoelectric thin film element D starts operating by the piezoelectric effect of the piezoelectric thin film 1. As a result, a portion of the diaphragm film 20 corresponding to the pressure chamber 22 deforms downward into a convex shape, thereby applying pressure to the pressure chamber 22 to force the ink in the pressure chamber 22 to jet from the ink nozzle 25.

Figure 7:
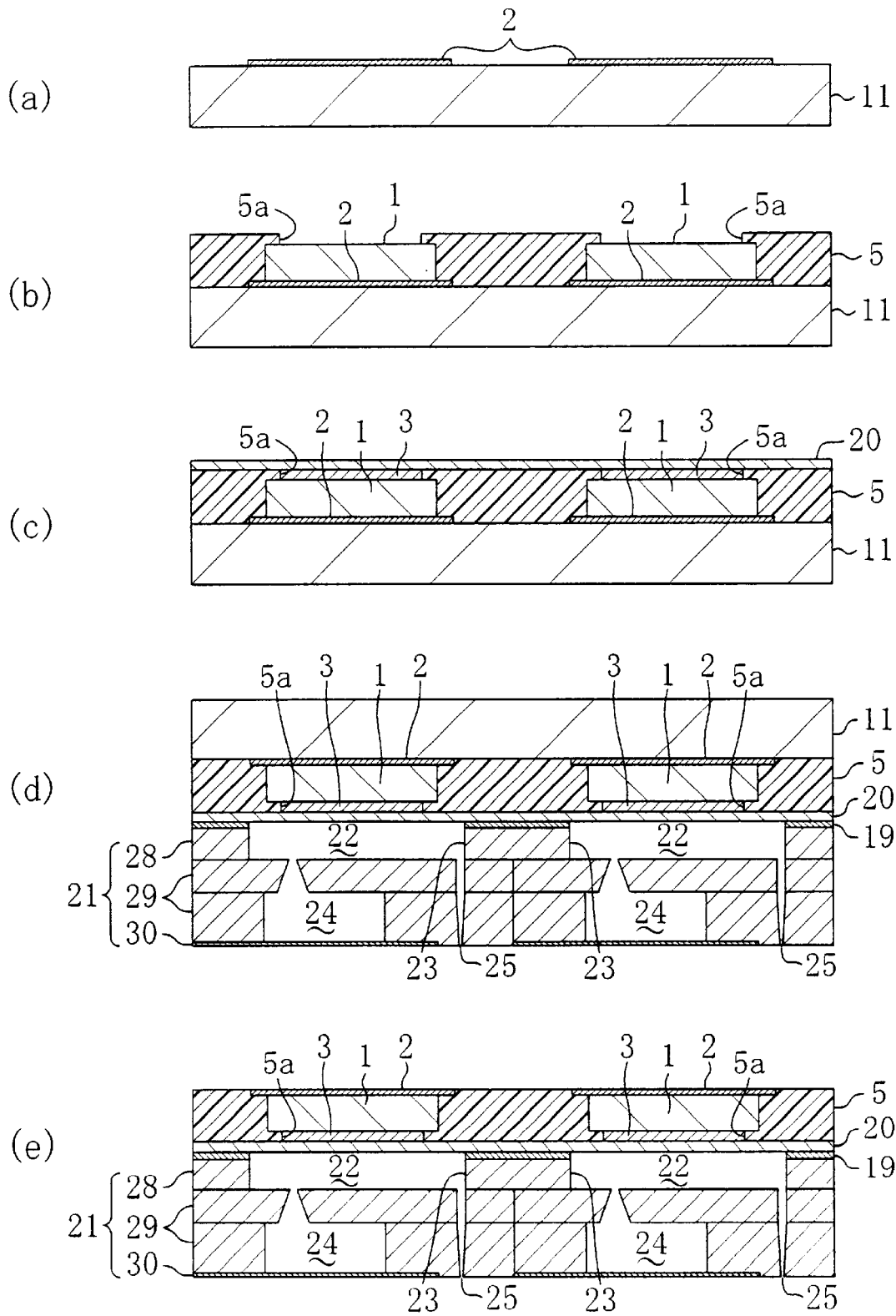
FIG. 7 illustrates a method of manufacturing the ink jet recording head of FIG. 6.

Next, a method of for the manufacture of the recording head H will be illustrated with reference to FIG. 7. The process up to the formation of the second electrode film 3 within the contact hole 5a of the hold film 5 is the same as the first embodiment and the related description is therefore omitted (see FIGS. 7(a) and 7(b)).

As shown in FIG. 7(c), the diaphragm film 20 is formed on the second electrode film 3 and on the hold film 5. Alternatively, an arrangement may be made in which the diaphragm film 20 is formed and then patterned such that the diaphragm film 20 is formed, only on a corresponding portion to the piezoelectric thin film 1. Moreover, in the case the diaphragm film 20 is made of metal material, the diaphragm film 20 can be formed together with the second electrode film 3 in a common process.

Following this, the diaphragm film 20 is fixed, through the adhesive layer 19, to the head body 21 prepared beforehand (see FIG. 7(d)). At this time, the recessed portion 23 of the head body 21 is positioned correspondingly with respect to the piezoelectric thin film 1.

Thereafter, the film formation substrate 11 is removed entirely by etching and the recording head H is completed (see FIG. 7(e)). During such etching removal step, as in the first embodiment, the etchant will not come into contact with the piezoelectric thin film 1, thereby protecting the piezoelectric thin film 1 from damage by the etchant. Accordingly, it is possible to maintain the ink emission performance of the recording head H at high level.

EMBODIMENT 4

Figure 8:
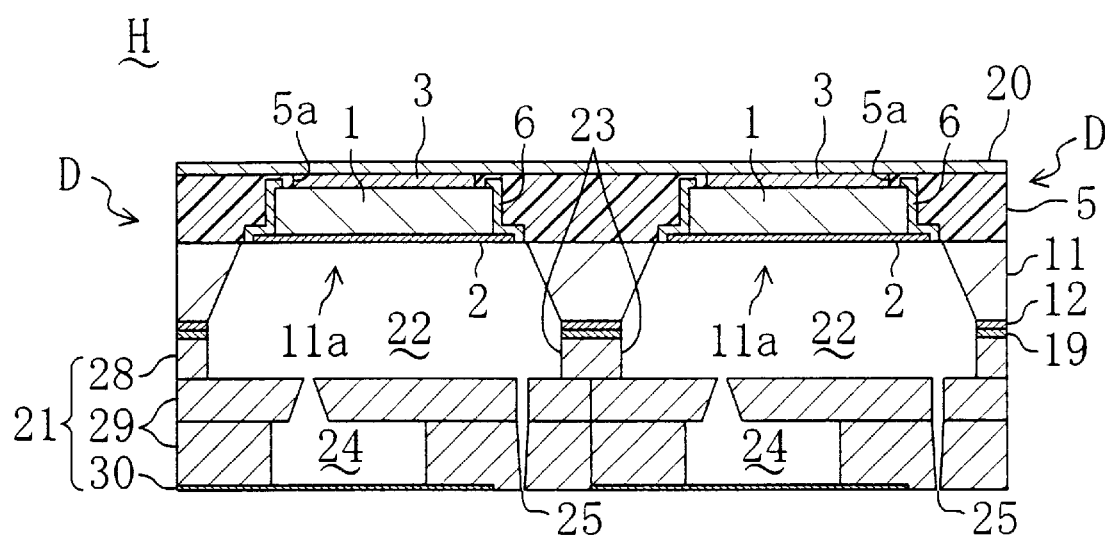
FIG. 8 is a view equivalent to FIG. 6, showing an ink jet recording head according to a fourth embodiment of the present invention.

FIG. 8 shows an ink jet recording head H in accordance with a fourth embodiment of the present invention. In this recording head H, the piezoelectric thin film element D of the second embodiment is used as a piezoelectric actuator and the head body 21 (see the third embodiment) is fixed onto the film formation substrate 11 of the piezoelectric thin film element D.

More specifically, in the fourth embodiment, the diaphragm film 20 (see the third embodiment) is formed on a surface of the second electrode film 3 of the piezoelectric thin film element D on the opposite side to the piezoelectric thin film 1 (i.e., the upper surface of the second electrode film 3) and on the upper surface of the hold film 5. The head body 21 is fixed, through the adhesive layer 19, to a surface of the film formation substrate 11 on the opposite side to the first electrode film 2 (i.e., a lower surface portion where the mask layer 12 is formed). The recessed portion 23 of the head body 21 is so provided as to be positioned correspondingly with respect to the etching removal portion 11a of the film formation substrate 11. The recessed portion 23 forms, together with the etching removal portion 11a, the pressure chamber 22.

Figure 9:
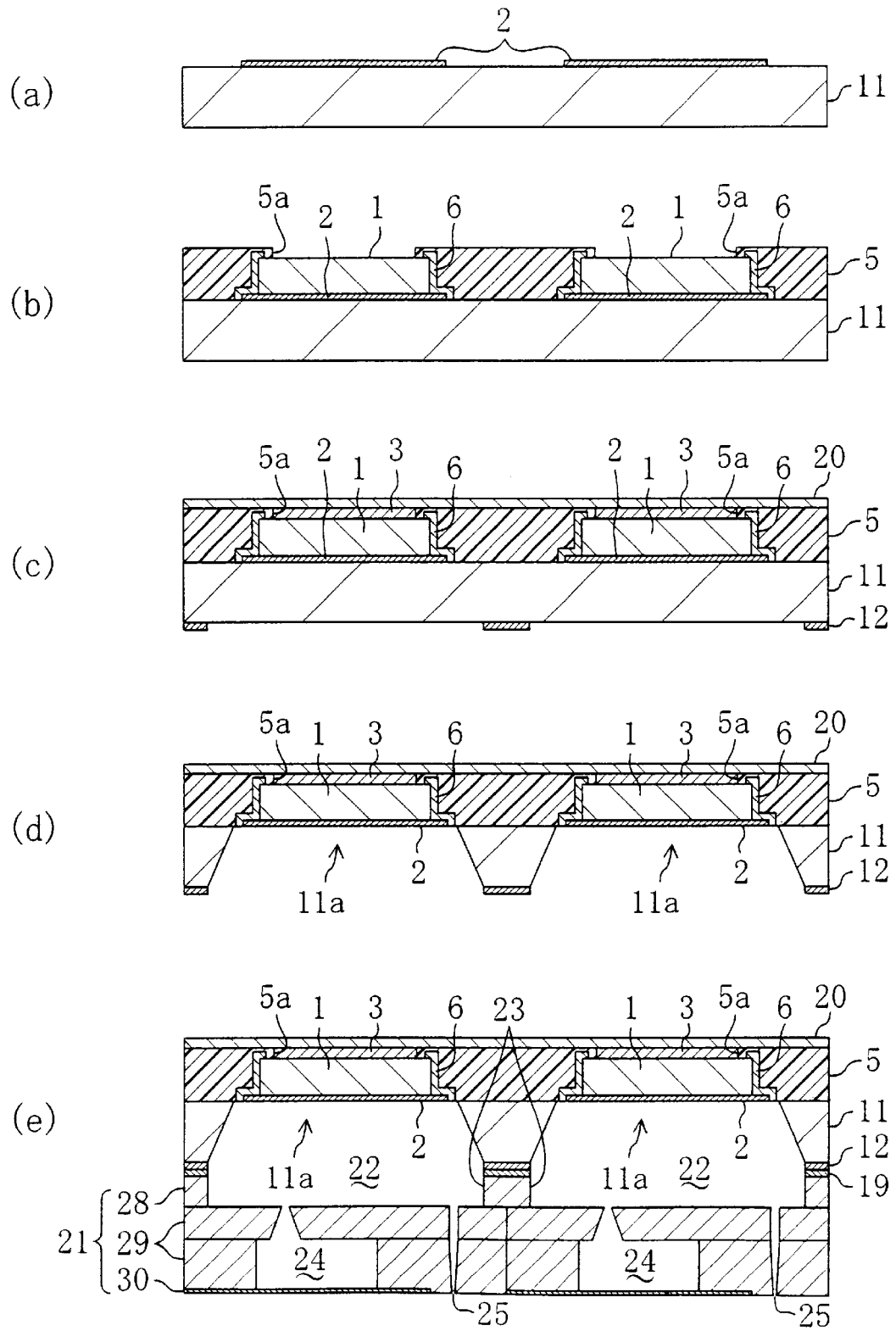
FIG. 9 illustrates a method of manufacturing the ink jet recording head of FIG. 8.

Next, a way of manufacturing the recording head H will be illustrated with reference to FIG. 9. The process up to the formation of the second electrode film 3 within the contact hole 5a of the hold film 5 is the same as the first embodiment and the related description is therefore omitted (see FIGS. 9(a) and 9(b)).

As shown in FIG. 9(c), the diaphragm film 20 is formed on the second electrode film 3 and on the hold film 5, as in the third embodiment, and the mask layer 12 is formed on other than the etching removal portion 11a of the lower surface of the film formation substrate 11.

Next, as in the second embodiment, a portion of the film formation substrate 11 corresponding to the piezoelectric thin film 1 is etched away to form the etching removal portion 11a (see FIG. 9(d)). During this etching removal step, the piezoelectric thin film 1 is not damaged by the etchant, as in the second embodiment.

Thereafter, a lower surface portion of the film formation substrate 11 where the mask layer 12 has been formed and the head body 21 prepared beforehand are fixed together through the adhesive layer 19 and the recording head H is completed (see FIG. 9(e)).

In the fourth embodiment, it is arranged such that the head body 21 and the film formation substrate 11 are fixed together. However, like the third embodiment, an arrangement may be made in which the film formation substrate 11 is removed entirely by etching and the head body 21 and the diaphragm film 20 are fixed together. On the contrary, another arrangement may be made in which a portion of the film formation substrate 11 corresponding to the piezoelectric thin film 1 is etched away and the film formation substrate 11 and the head body 21 are fixed together in the third embodiment.

INDUSTRIAL APPLICABILITY

The present invention provides a piezoelectric thin film element useful for pyroelectric devices and piezoelectric devices. Further, the present invention provides an ink jet recording head useful for printers for computers, facsimile machines, photocopiers, et cetera. The industrial applicability of the present invention is high because the present invention ensures that the piezoelectric thin film is protected from damage by etchant.

What is claimed is:

1. A piezoelectric thin film element,
    said piezoelectric thin film element comprising a piezoelectric thin film, a first and a second electrode film which are formed respectively on opposite surfaces of said piezoelectric thin film in the direction of the thickness of said piezoelectric thin film, and a hold film which is so formed as to closely adhere to the overall circumference of a lateral surface of said piezoelectric thin film and which holds said piezoelectric thin film;
    said piezoelectric thin film element being manufactured by forming on a film formation substrate all of said films with said first electrode film brought into contact with said film formation substrate and thereafter by removing a portion of said film formation substrate corresponding to at least said piezoelectric thin film using an etchant;
    wherein said first electrode film is formed such that the overall circumference of a peripheral edge portion of said first electrode film extends beyond the lateral surface of said piezoelectric thin film and closely adheres to said hold film while defining a curved etchant penetrable route between said first electrode and said hold film; and
    wherein the extent of said peripheral edge portion of said first electrode film and the length and curved nature of said etchant penetrable route prevents said etchant from penetrating sufficiently to reach said piezoelectric thin film during removal of said film formation substrate.

2. A piezoelectric thin film element,
    said piezoelectric thin film element comprising a piezoelectric thin film, a first and a second electrode film which are formed respectively on opposite surfaces of said piezoelectric thin film in the direction of the thickness of said piezoelectric thin film, and a hold film which is so formed as to closely adhere to the overall circumference of a lateral surface of said piezoelectric thin film and which holds said piezoelectric thin film;
    said piezoelectric thin film element being manufactured by forming on a film formation substrate all of said films with said first electrode film brought into contact with said film formation substrate and thereafter by removing a portion of said film formation substrate corresponding to at least said piezoelectric thin film using an etchant;
    wherein said hold film is so formed as to closely adhere through a protective film formed of a material different from the material of said hold film, to the overall circumference of the lateral surface of said piezoelectric thin film; and
    wherein said protective film is formed such that the overall circumference of an end portion of said protective film on the side of said first electrode film closely adheres to a peripheral edge portion of said first electrode film while defining a curved etchant penetrable route between said first electrode and said hold film.

3. The piezoelectric thin film element of claim 1 or claim 2, wherein said piezoelectric thin film is formed of ferroelectric material.

4. An ink jet recording head comprising:
    (a) a piezoelectric thin film element;
        said piezoelectric thin film element comprising a piezoelectric thin film formed of ferroelectric material, a first and a second electrode film which are formed respectively on opposite surfaces of said piezoelectric thin film in the direction of the thickness of said piezoelectric thin film, and a hold film which is so formed as to closely adhere to the overall circumference of a lateral surface of said piezoelectric thin film and which holds said piezoelectric thin film;
        said piezoelectric thin film element being manufactured by forming on a film formation substrate all of said films with said first electrode film brought into contact with said film formation substrate and thereafter by removing said entire film formation substrate using an etchant;
    (b) a head body;
        said head body being positioned, through a diaphragm film, on a surface of said second electrode film of said piezoelectric thin film element on the side opposite to said piezoelectric thin film;
        said head body including a recessed portion which becomes a pressure chamber when blocked by said diaphragm film, an ink supply passage for supplying ink to said pressure chamber, and an ink nozzle in communication with said pressure chamber;
    wherein said piezoelectric thin film element is operated by applying voltage to said piezoelectric thin film through said first and second electrode films, thereby applying pressure to said pressure chamber to cause the ink in said pressure chamber to jet from said ink nozzle;
    wherein said first electrode film of said piezoelectric thin film element is formed such that the overall circumference of a peripheral edge portion of said first electrode film extends beyond the lateral surface of said piezoelectric thin film and closely adheres to said hold film while defining a curved etchant penetrable route between said first electrode and said hold film; and
    wherein the extent of said peripheral edge portion of said first electrode film and the length and curved nature of said etchant penetrable route prevents said etchant from penetrating sufficiently to reach said piezoelectric thin film during removal of said film formation substrate.

5. An ink jet recording head comprising:
    (a) a piezoelectric thin film element;
        said piezoelectric thin film element comprising a piezoelectric thin film formed of ferroelectric material, a first and a second electrode film which are formed respectively on opposite surfaces of said piezoelectric thin film in the direction of the thickness of said piezoelectric thin film, and a hold film which is so formed as to closely adhere to the overall circumference of a lateral surface of said piezoelectric thin film and which holds said piezoelectric thin film;

said piezoelectric thin film element being manufactured by forming on a film formation substrate all of said films with said first electrode film brought into contact with said film formation substrate and thereafter by removing a portion of said film formation substrate corresponding to said piezoelectric thin film using an etchant;

(b) a head body;

said head body being positioned on a surface of said film formation substrate of said piezoelectric thin film element on the side opposite to said first electrode film;

said head body including a recessed portion which forms together with a portion of said film formation substrate resulting from said etching removal, a pressure chamber, an ink supply passage for supplying ink to said pressure chamber, and an ink nozzle in communication with said pressure chamber; and (c) a diaphragm film which is formed on a surface of said second electrode film of said piezoelectric thin film element on the side opposite to said piezoelectric thin film;

wherein said piezoelectric thin film element is operated by applying voltage to said piezoelectric thin film through said first and second electrode films, thereby applying pressure to said pressure chamber to cause the ink in said pressure chamber to jet from said ink nozzle;

wherein said first electrode film of said piezoelectric thin film element is formed such that the overall circumference of a peripheral edge portion of said first electrode film extends beyond the lateral surface of said piezoelectric thin film and closely adheres to said hold film while defining a curved etchant penetrable route between said first electrode and said hold film; and wherein the extent of said peripheral edge portion of said first electrode film and the length and curved nature of said etchant penetrable route prevents said etchant from penetrating sufficiently to reach said piezoelectric thin film during removal of said film formation substrate.

6. An ink jet recording head comprising:

(a) a piezoelectric thin film element;

said piezoelectric thin film element comprising a piezoelectric thin film formed of ferroelectric material, a first and a second electrode film which are formed respectively on opposite surfaces of said piezoelectric thin film in the direction of the thickness of said piezoelectric thin film, and a hold film which is so formed as to closely adhere to the overall circumference of a lateral surface of said piezoelectric thin film and which holds said piezoelectric thin film;

said piezoelectric thin film element being manufactured by forming on a film formation substrate all of said films with said first electrode film brought into contact with said film formation substrate and thereafter by removing a portion of said film formation substrate corresponding to said piezoelectric thin film using an etchant;

(b) a head body;

said head body being positioned on a surface of said film formation substrate of said piezoelectric thin film element on the side opposite to said first electrode film;

said head body including a recessed portion which forms, together with a portion of said film formation substrate resulting from said etching removal, a pressure chamber, an ink supply passage for supplying ink to said pressure chamber, and an ink nozzle in communication with said pressure chamber; and (c) a diaphragm film which is formed on a surface of said second electrode film of said piezoelectric thin film element on the side opposite to said piezoelectric thin film;

wherein said piezoelectric thin film element is operated by applying voltage to said piezoelectric thin film through said first and second electrode films, thereby applying pressure to said pressure chamber to cause the ink in said pressure chamber to jet from said ink nozzle;

wherein said hold film of said piezoelectric thin film element is so formed as to closely adhere, through a protective film formed of a material different from the material of said hold film, to the overall circumference of the lateral surface of said piezoelectric thin film; and wherein said protective film is formed such that the overall circumference of an end portion of said protective film on the side of said first electrode film closely adheres to the overall circumference of a peripheral edge portion of said first electrode film while defining a curved etchant penetrable route between said first electrode and said hold film.

7. An ink jet recording head comprising:

(a) a piezoelectric thin film element;

said piezoelectric thin film element comprising a piezoelectric thin film formed of ferroelectric material, a first and a second electrode film which are formed respectively on opposite surfaces of said piezoelectric thin film in the direction of the thickness of said piezoelectric thin film, and a hold film which is so formed as to closely adhere to the overall circumference of a lateral surface of said piezoelectric thin film and which holds said piezoelectric thin film;

said piezoelectric thin film element being manufactured by forming on a film formation substrate all of said films with said first electrode film brought into contact with said film formation substrate and thereafter by removing said entire film formation substrate using an etchant;

(b) a head body;

said head body being positioned, through a diaphragm film, on a surface of said second electrode film of said piezoelectric thin film element on the side opposite to said piezoelectric thin film;

said head body including a recessed portion which becomes a pressure chamber when blocked by said diaphragm film, an ink supply passage for supplying ink to said pressure chamber, and an ink nozzle in communication with said pressure chamber;

wherein said piezoelectric thin film element is operated by applying voltage to said piezoelectric thin film through said first and second electrode films, thereby applying pressure to said pressure chamber to cause the ink in said pressure chamber to jet from said ink nozzle;

wherein said hold film of said piezoelectric thin film element is so formed as to closely adhere, through a protective film formed of a material different from the material of said hold film, to the overall circumference of the lateral surface of said piezoelectric thin film; and wherein said protective film is formed such that the overall circumference of an end portion of said protective film on the side of said first electrode film closely adheres to the overall circumference of a peripheral edge portion of said first electrode film while defining a curved etchant penetrable route between said first electrode and said hold film.

8. A method for the manufacture of a piezoelectric thin film element comprising:
- a step of forming a first electrode film on a film formation substrate;
- a step of forming a piezoelectric thin film on other than the overall circumference of a peripheral edge portion of said first electrode film;
- a step of forming a hold film all around said piezoelectric thin film over said film formation substrate so that said hold film closely adheres to the overall circumference of a lateral surface of said piezoelectric thin film and to the overall circumference of said peripheral edge portion of said first electrode film while defining a curved etchant penetrable route between said first electrode and said hold film;
- a step of forming a second electrode film on said piezoelectric thin film; and
- after completion of all of said above steps, removing, a portion of said film formation substrate corresponding to at least said piezoelectric thin film using an etchant, said etchant prevented from penetrating sufficiently to reach said piezoelectric thin film during removal of said film formation substrate by said the length and curved nature of said etchant penetrable route;
- wherein the extent of said peripheral edge portion of said first electrode film and the length and curved nature of said etchant penetrable route prevents said etchant from penetrating sufficiently to reach said piezoelectric thin film during removal of said film formation substrate.

9. A method for the manufacture of a piezoelectric thin film element comprising:
- a step of forming a first electrode film on a film formation substrate;
- a step of forming a piezoelectric thin film on said first electrode film;
- a step of forming a protective film all around said piezoelectric thin film over said film formation substrate so that said protective film closely adheres to the overall circumference of a lateral surface of said piezoelectric thin film and to the overall circumference of a peripheral edge portion of said first electrode film;
- a step of forming a hold film all around said protective film over said film formation substrate so that said hold film closely adheres to said protective film and is formed of a material different from the material of said protective film while defining a curved etchant penetrable route between said first electrode and said hold film;
- a step of forming a second electrode film on said piezoelectric thin film; and
- after completion of all of said above steps, removing, a portion of said film formation substrate corresponding to at least said piezoelectric thin film using an etchant.

10. A method for the manufacture of an ink jet recording head comprising a piezoelectric thin film element which undergoes deformation, together with a diaphragm film, by the piezoelectric effect of a piezoelectric thin film formed of ferroelectric material, thereby causing ink in a pressure chamber to jet therefrom, said manufacture method comprising:
- a step of forming a first electrode film on a film formation substrate;
- a step of forming said piezoelectric thin film on other than the overall circumference of a peripheral edge portion of said first electrode film;
- a step of forming a hold film all around said piezoelectric thin film over said film formation substrate so that said hold film closely adheres to the overall circumference of a lateral surface of said piezoelectric thin film and to the overall circumference of said peripheral edge portion of said first electrode film while defining a curved etchant penetrable route between said first electrode and said hold film;
- a step of forming a second electrode film on said piezoelectric thin film;
- a step of forming said diaphragm film on said second electrode film;
- a step of fixing said diaphragm film and a head body having a recessed portion which forms, together with said diaphragm film, a pressure chamber; and
- upon completion of all of said above steps, removing, said entire film formation substrate using an etchant;
- wherein the extent of said peripheral edge portion of said first electrode film and the length and curved nature of said etchant penetrable route prevents said etchant from penetrating sufficiently to reach said piezoelectric thin film during removal of said film formation substrate.

11. A method for the manufacture of an ink jet recording head comprising a piezoelectric thin film element which undergoes deformation, together with a diaphragm film, by the piezoelectric effect of a piezoelectric thin film formed of ferroelectric material, thereby causing ink in a pressure chamber to jet therefrom, said manufacture method comprising:
- a step of forming a first electrode film on a film formation substrate;
- a step of forming said piezoelectric thin film on said first electrode film;
- a step of forming a protective film all around said piezoelectric thin film over said film formation substrate so that said protective film closely adheres to the overall circumference of a lateral surface of said piezoelectric thin film and to the overall circumference of a peripheral edge portion of said first electrode film;
- a step of forming a hold film all around said protective film over said film formation substrate so that said hold film closely adheres to said protective film and is formed of a material different from the material of said protective film while defining a curved etchant penetrable route between said first electrode and said hold film
- a step of forming a second electrode film on said piezoelectric thin film;
- a step of forming said diaphragm film on said second electrode film;
- upon completion of all of said above steps, removing a portion of said film formation substrate corresponding to said piezoelectric thin film using an etchant; and
- after said etching said film formation substrate, a step of fixing said film formation substrate and a head body having a recessed portion to form said pressure chamber.

12. A piezoelectric thin film element,
said piezoelectric thin film element comprising a piezoelectric thin film, a first electrode film formed on a surface of said piezoelectric thin film and in a direction of the thickness of said piezoelectric thin film such that the overall circumference of the peripheral edge portion extends more than a lateral surface of said piezoelectric thin film, a second electrode film formed on a surface of said piezoelectric thin film and in a direction opposite to the thickness of said piezoelectric thin film, and a hold film formed on the overall circumference of the lateral surface of said piezoelectric thin film to holds said piezoelectric thin film and define a curved etchant penetrable route between said first electrode and said hold film;

wherein said curved etchant penetrable route is operable to prevent an etchant, applied at said first electrode film, from reaching said piezoelectric thin film.

13. A piezoelectric thin film element, said piezoelectric thin film element comprising a piezoelectric thin film, a first electrode film formed on a surface of said piezoelectric thin film and in a direction of the thickness of said piezoelectric thin film such that the overall circumference of the peripheral edge portion extends more than a lateral surface of said piezoelectric thin film, a second electrode film formed on a surface of said piezoelectric thin film and in a direction opposite to the thickness of said piezoelectric thin film, and a hold film formed on the overall circumference of the lateral surface of said piezoelectric thin film and the overall circumference of the lateral surface of said first electrode film to hold said piezoelectric thin film while defining a curved etchant penetrable route between said first electrode and said hold film, said curved etchant penetrable route operable to prevent an etchant, applied at said first electrode film, from reaching said piezoelectric thin film;

wherein the overall circumference of the peripheral edge portion of said first electrode film extends more that the lateral surface of said piezoelectric thin film by 1–50 µm.

14. A piezoelectric thin film element, said piezoelectric thin film element comprising a piezoelectric thin film, a first electrode film formed on a surface of said piezoelectric thin film and in a direction of the thickness of said piezoelectric thin film such that the overall circumference of the peripheral edge portion extends more than a lateral surface of said piezoelectric thin film, a second electrode film formed on a surface of said piezoelectric thin film and in a direction opposite to the thickness of said piezoelectric thin film, and a hold film formed on the overall circumference of the lateral surface of said piezoelectric thin film and the overall circumference of the lateral surface of said first electrode film to hold said piezoelectric thin film and define a curved etchant penetrable route between said first electrode and said hold film, said curved etchant penetrable route operable to prevent an etchant, applied generally at said first electrode film and said hold film, from reaching said piezoelectric thin film;

wherein a surface of a lateral portion that extends beyond said first electrode film of said hold film is made flush with a surface of said first electrode film that is opposite to the surface on which said piezoelectric thin film is formed.

15. A piezoelectric thin film element, said piezoelectric thin film element comprising a piezoelectric thin film, a first and a second electrode film which are formed respectively on opposite surfaces of said piezoelectric thin film in the direction of the thickness of said piezoelectric thin film, a hold film which is formed on the overall circumference of a lateral surface of said piezoelectric thin film and holds said piezoelectric thin film, and a protective film formed of a material different from the material of said hold film and formed between said piezoelectric thin film and said hold film such that said protective film covers the lateral surface of said piezoelectric thin film while defining a curved etchant penetrable route between said first electrode and said hold film, said curved etchant penetrable route operable to prevent an etchant, applied generally at said first electrode film and said hold film, from reaching said piezoelectric thin film.

16. A piezoelectric thin film element, said piezoelectric thin film element comprising a piezoelectric thin film, a first and a second electrode film which are formed respectively on opposite surfaces of said piezoelectric thin film in the direction of the thickness of said piezoelectric thin film, a hold film which is formed on the overall circumference of a lateral surface of said piezoelectric thin film and holds said piezoelectric thin film, and a protective film formed between said piezoelectric thin film and said hold film such that said protective film covers the lateral surface of said piezoelectric thin film and adheres to said piezoelectric thin film and said hold film while defining a curved etchant penetrable route between said first electrode and said hold film, said curved etchant penetrable route operable to prevent an etchant, applied generally at said first electrode film and said hold film, from reaching said piezoelectric thin film;

wherein the adhesion between said first electrode film and said protective film is greater than the adhesion between said protective film and said hold film.

* * * * *

UNITED STATES PATENT AND TRADEMARK OFFICE
CERTIFICATE OF CORRECTION

PATENT NO. : 6,688,731 B1
DATED : February 10, 2004
INVENTOR(S) : Satoru Fujii et al.

It is certified that error appears in the above-identified patent and that said Letters Patent is hereby corrected as shown below:

Column 4,
Line 31, "the piezoelectric thin of film" should be -- the piezoelectric thin film --

Column 10,
Line 22, "a high frequency magnetron" should be -- a radio frequency magnetron --

Column 21,
Line 30, "by the said length" should be -- by the length --

Column 23,
Line 9, "holds" should be -- hold --
Line 36, "more that" should be -- more than --

Signed and Sealed this

Sixteenth Day of November, 2004

JON W. DUDAS
*Director of the United States Patent and Trademark Office*